United States Patent [19]

Karulkar

[11] Patent Number: 5,116,771
[45] Date of Patent: May 26, 1992

[54] THICK CONTACTS FOR ULTRA-THIN SILICON ON INSULATOR FILMS

[75] Inventor: Pramod C. Karulkar, Burlington, Mass.

[73] Assignee: Massachusetts Institute of Technology, Cambridge, Mass.

[21] Appl. No.: 326,169

[22] Filed: Mar. 20, 1989

[51] Int. Cl.[5] .................... H01L 21/265; H01L 21/86
[52] U.S. Cl. ........................ 437/40; 437/21; 357/23.7
[58] Field of Search .............. 437/21, 24, 34; 357/23.7

[56] References Cited

U.S. PATENT DOCUMENTS

| | | | |
|---|---|---|---|
| 4,183,134 | 1/1980 | Oehler et al. | 29/571 |
| 4,700,461 | 10/1987 | Choi et al. | 437/41 |
| 4,717,686 | 1/1988 | Jacobs et al. | 437/56 |

FOREIGN PATENT DOCUMENTS

| | | | |
|---|---|---|---|
| 0068651 | 5/1980 | Japan | 437/24 |
| 0010266 | 1/1982 | Japan | 357/23.7 |
| 117782 | 6/1985 | Japan | |
| 296563 | 12/1987 | Japan | |

OTHER PUBLICATIONS

"High Performance SOIMOSFET Using Ultra-Thin SOI Film", Yoshimi et al., IEDM 87, pp. 640-643.
"Self-Aligned Contact Schemes for Source-Drains in Submicron Devices", W. T. Lynch, IEDM 87, pp. 354-357.
"Rapid Thermal Growth of Thin Silicon Dielectrics for ULSI Applications", J. Nulman, Proc. 1st Int'nl Symp on ULSI Science and Technology, Proc. vol. 87-11, Electrochemical Society, (1987), p. 141.
"Local Oxidation of Silicon and Its Application in Semiconductor-Device Technology", Appels et al., *Phillips Res. Repts 25*, pp. 118-132, 1970.
"Application of Selective Silicon Epitaxial Growth for CMOS Technology", Nagao et al., *IEEE Transactions on Electron Devices*, vol. ED-33, No. 11, Nov. 1986, pp. 1738-1744.
"A Metal-Gate Self-Aligned MOSFET Using Nitride Oxide", Schmidt, et al., *IEEE Transactions on Electron Devices*, vol. ED-32, No. 3, Mar. 1985, pp. 643-648.
"Local Oxidation of Silicon; New Technological Aspects", Appels, et al., *Philipps. Res. Repts 26*, 157-165, 1971.
"Novel SOI CMOS Design Using Ultra Thin Near Intrinsic Substrate", Malhi et al., IEEE 1982, pp. 107-110.
"A High Performance Submicrometer CMOS/SOI Technology Using Ultrathin Silicon Films on SIMOX", Vasudev et al., pp. 61-62, Technical Digest of 1988 Symp. on VLSI Technol., May 1988, IEEE.

*Primary Examiner*—Olik Chaudhuri
*Assistant Examiner*—Long Pham
*Attorney, Agent, or Firm*—Hamilton, brook, Smith & Reynolds

[57] ABSTRACT

CMOS devices on SOI and a method for making such devices with ultra-thin Si channel regions and thick Si drain and source regions for good contact surfaces are described.

10 Claims, 5 Drawing Sheets

5,116,771

THICK CONTACTS FOR ULTRA-THIN SILICON ON INSULATOR FILMS

GOVERNMENT SPONSORSHIP

The U.S. Government has rights to this invention pursuant to the Department of the Air Force Contract No. F19628-85-C-0002.

BACKGROUND OF THE INVENTION

Silicon on insulator (SOI) complementary metal oxide semiconductor (CMOS) technology has recently received a great degree of attention because it potentially offers high circuit speeds through reduction in parasitic capacitance, freedom from latch-up, higher density, and resistance to transient radiation effects. Until very recently, most SOI work has involved relatively thick (300 to 500 nm) silicon layers. Heretofore, CMOS circuits made on such layers have been found to suffer from floating body effects and short channel characteristics. These deficiencies are the main barrier to building high density, high speed SOI circuits using submicron MOS devices.

In an effort to avoid these problems inherent in such relatively thick films, researchers have turned to ultra-thin (less than 100 nm) Si films made on buried oxide insulators, i.e., SOI structures. Theoretical modeling and initial experimental work has demonstrated the advantages of fabricating CMOS devices in ultra-thin SOI films. These devices are an attractive choice for building the next generation ultra-large scale integrated (ULSI) circuits. (See "Comparison of Thin Film Transistor and SOI Technologies", H. W. Lam and M. J. Thompson (Eds), North Holland Publishing Company, New York, 1984 and M. Yoshimi, T. Wada, K. Kato, H. Tango, *Technical Digest of the* 1987 International Electron Devices Meeting, IEEE, Piscataway, N.J. 1987, p. 640.)

However, fabrication of CMOS devices in ultra-thin silicon films is not free from problems of its own. In addition to the difficulties associated with obtaining near defect-free SOI substrates, the next most difficult problem is the making of suitable contacts to the device in the ultra-thin source and drain regions.

When the Si film is extra-thin, the thick metallization contact film necessary for low resistance connection to the transistor source and drain regions has a tendency to dissolve the ultra-thin silicon film to which it is supposed to make contact.

If the full thickness of the ultra-thin silicon film dissolves, the contact fails. Many solutions to the problem of making contact to very shallow source and drain regions have been proposed in the prior art (W. R. Lynch, Technical Digest of the 1987 *International Electron Devices Meeting*, IEEE, Piscataway, N.J. 1987, p. 354). All the practical solutions involve the use of novel materials, structures, and processes resulting in fabrication complexity, increased costs and reduced yields. Moreover, all the methods used for contacts to ultra-thin source and drain regions become even more difficult to implement in the specific example of SOI substrates with a silicon thickness of less than 100 nm.

SUMMARY OF THE INVENTION

This invention provides a structure and a process which allows the use of ultra-thin silicon films in the critical (channel region) part of the MOS device, yet avoids the complications of making contacts to the ultra-thin Si film in the source and drain regions. It does so by using relatively thick, instead of ultra-thin, silicon film in the source and drain regions.

Two alternate embodiments of the invention are provided. In both embodiments, the top Si film of the SOI substrate is initially formed thick enough (approximately 250 nm or more) to provide adequately thick drain and source contact regions which will not dissolve when metallization is applied to these regions. Then, the Si channel region is thinned to an ultra-thin thickness of less than about 100 nm. In one embodiment, this channel region is thinned by a Local Oxidation of Silicon (LOCOS) process which selectively oxidizes a top volume of the silicon channel region. In the alternate solution, thinning is accomplished by oxygen ion implantation of the silicon channel region to deplete the silicon and to increase the thickness of the buried oxide by oxidizing the silicon in the channel region from below leaving a thickness of less than about 100 nm. In each case, the source and drain regions remain relatively thick for good ohmic contact formation.

DETAILED DESCRIPTION OF THE INVENTION

LOCOS Thinning Embodiment

Figure 1:
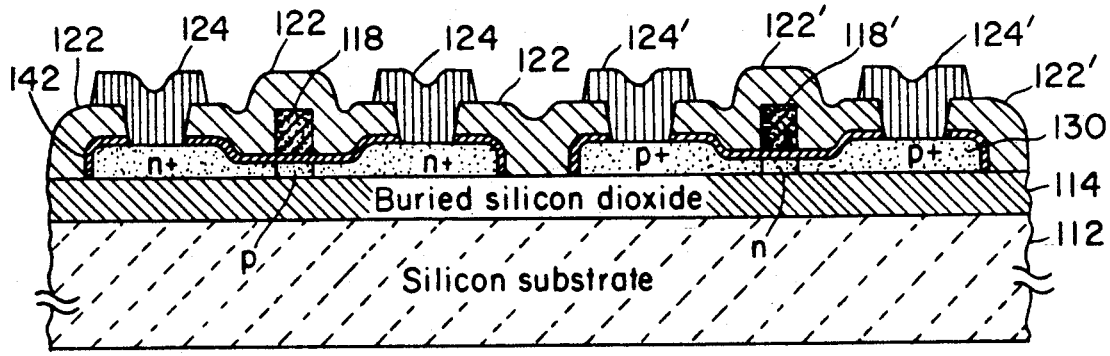
FIG. 1 is a cross-sectional view of a portion of a CMOS device on an SOI chip with an ultra-thin Si film in accordance with a LOCOS thinning embodiment the present invention.

Referring now to FIGS. 1 and 2a-2k, a LOCOS thinning embodiment of the invention will now be described in detail. It should be noted that in all embodiments, the preferred substrate starting structure is an SOI chip or wafer; The wafers may be formed by a number of well-known techniques, such as Zone Melting and Recrystallization (ZMR) or Separation by Implanted OXygen (SIMOX). The end objective is to form a good quality epitaxial film of silicon 130 on a buried oxide insulator 114 supported by a bulk silicon substrate 112 (See FIG. 2a). Other starting substrates, such as silicon-on-sapphire (SOS), are contemplated. Initially, the epitaxial Si film 130 is relatively thick (about 200-400 nm). A thin sacrificial oxide layer 140 of about 15 nm is then formed on the Si layer 130 by thermal oxidation. This film can be used as an etch stop for subsequent processing.

Figure 2A:
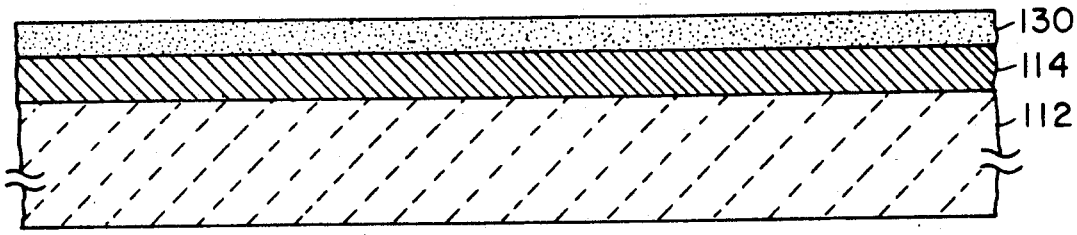
FIGS. 2a-2k are schematic cross-sectional process flow diagrams illustrating the major steps in processing an SOI substrate to fabricate a CMOS device in accordance with the LOCOS Thinning embodiment of the invention.
Figure 2B:
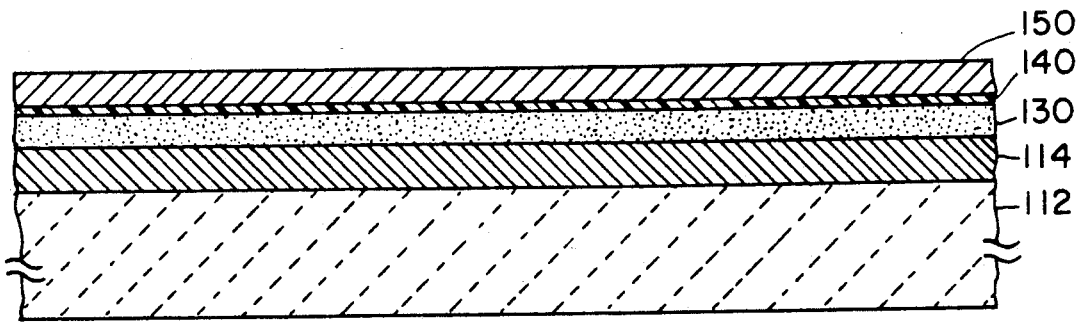
Figure 2C:
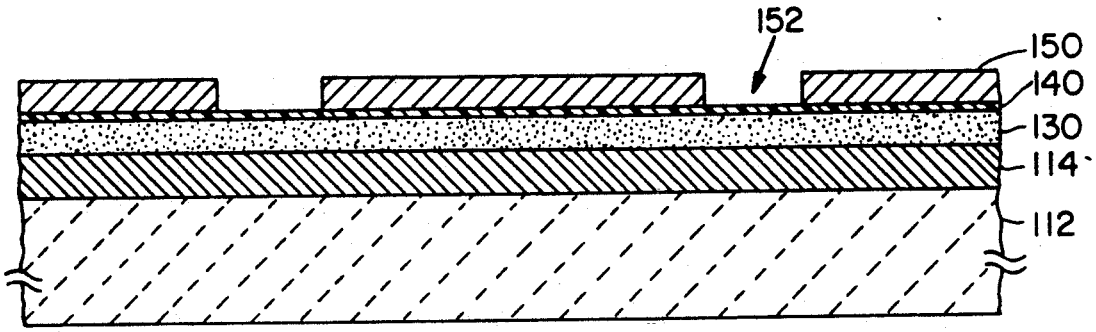
Figure 2D:
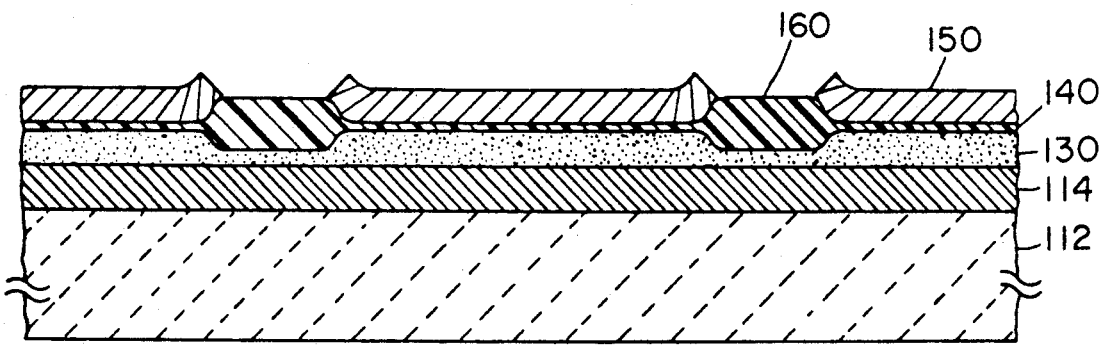
Figure 2E:
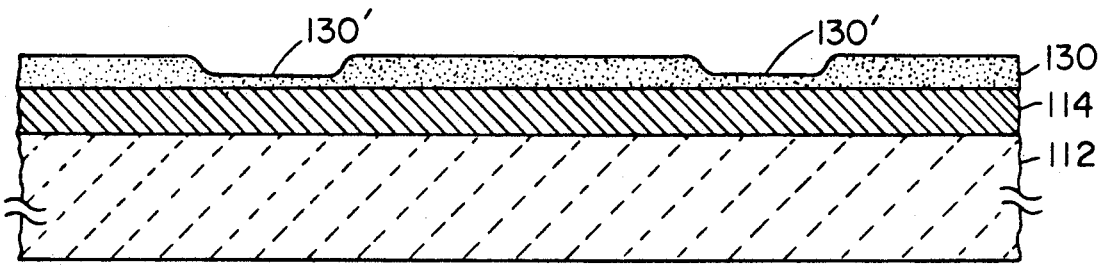
Figure 2F:
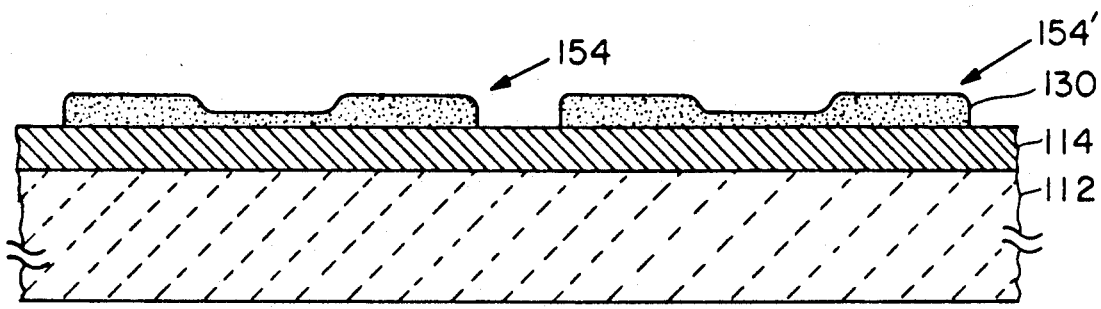
Figure 2G:
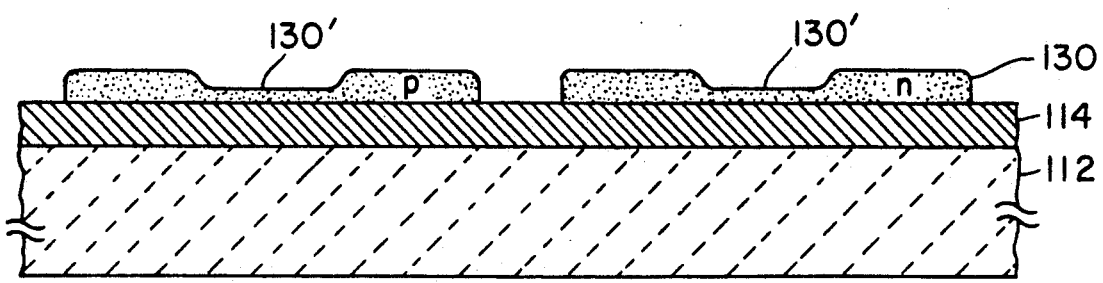
Figure 2H:
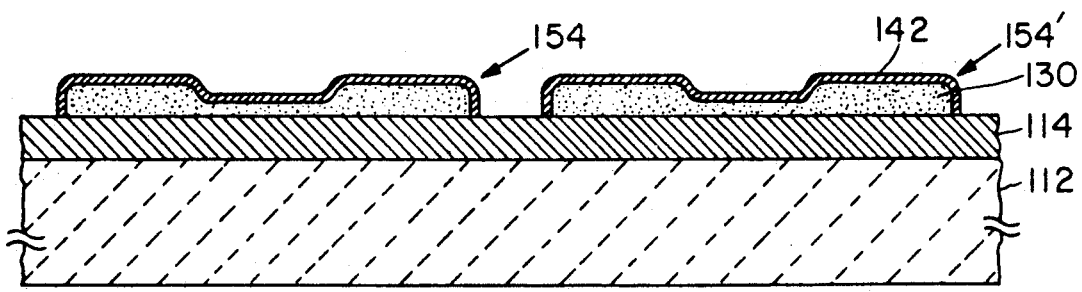
Figure 2I:
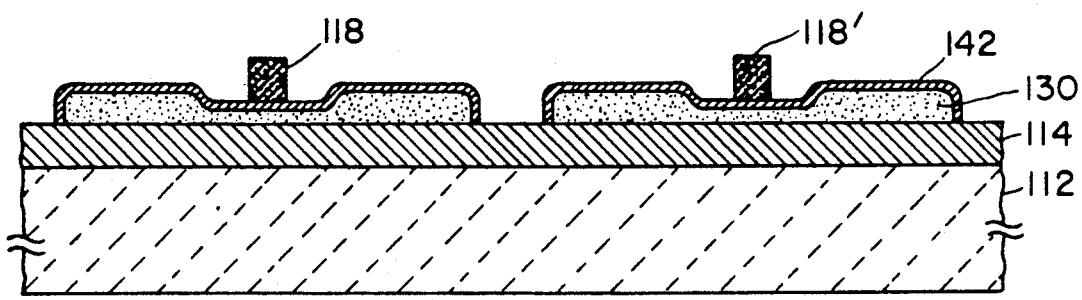
Figure 2J:
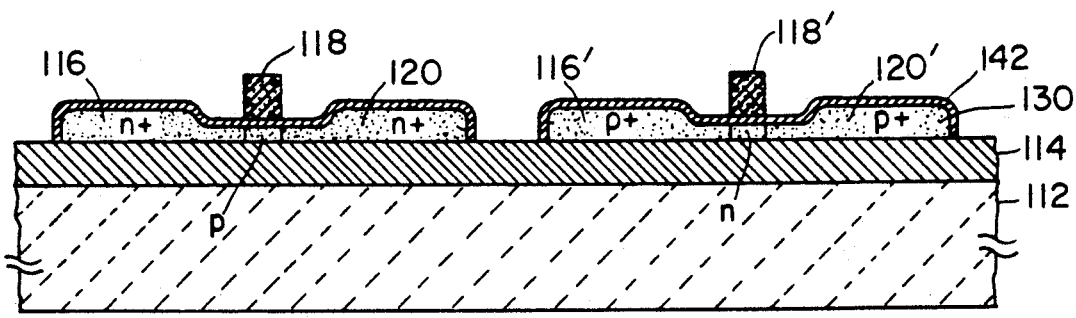
Figure 2K:
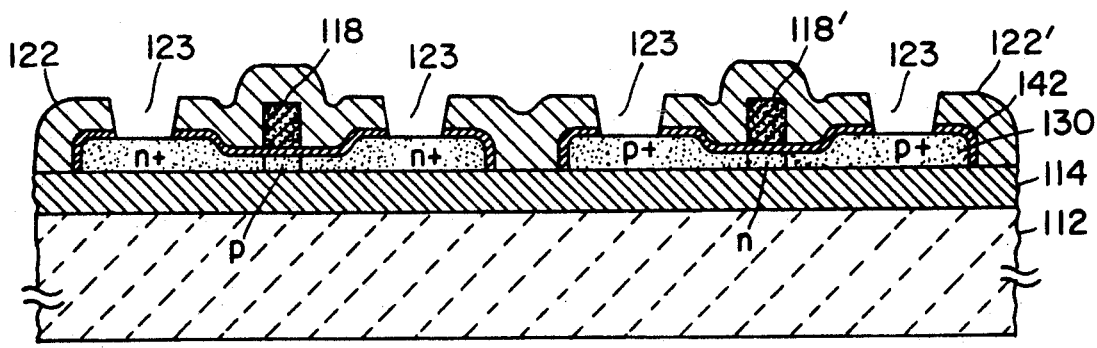

Next, a thin (100 nm) silicon nitride ($Si_3N_4$) mask layer 150 is formed over the oxide 140, preferably by low pressure chemical vapor deposition (LPCVD) (See FIG. 2b). The mask layer 150 is coated with photoresist (not shown) and an ultra-thin or channel mask area is exposed. This mask area defines the areas where the channel regions of the silicon layer 130 must be thinned down. In addition, it also defines an optional permanent set of alignment keys (not shown) which may be used to align island definition, island implant, and the gate electrode layers. The nitride 150 is now etched using the first sacrificial oxide 140 as the etch stop (See FIG. 2c). Optionally, at this point, the FIG. 2c structure is coated with resist, exposed and developed in a pattern which opens up only the areas required for alignment marks and self-aligned to the nitride layer 150, are etched into the silicon film by dry etching (not shown).

All the resist is then cleaned off the substrate and a thick oxide layer 160 (200–400 nm) is grown locally by the LOCOS process in the windows 152 etched in the nitride 150. The total thickness of the oxide is controlled to consume a predetermined amount of the silicon film 130 (See FIG. 2d).

The oxide 160 and nitride 150 are then removed by etching to expose the thick 130' thinned silicon. The thinned silicon 130' is located in the channel region where the device channel is to be formed. A definition mask to define the regions for different transistors is applied to the structure and the exposed silicon is etched by a dry etch to form separate regions 154 and 154' of silicon film, known as silicon islands. Each island is later converted to a transistor. A thin layer of a second sacrificial oxide (not shown) is then grown (8 nm). Ion implants (masked and unmasked) are made to the Si islands 154 and 154' to adjust the doping of the islands (See FIG. 2g). The second sacrificial oxide (8 nm) layer is etched off. A gate oxide 142 (10 nm or more) is then formed over the silicon islands 154 and 154'. Polysilicon gate (See FIG. 2i) electrodes 118 and 118' are formed over the channel regions 130' by depositing polycrystalline silicon and patterning the electrodes by photolithography and etching. Source and drain regions 116, 116' and 120, 120' are formed by self-aligned ion implantation (See FIG. 2j), and a passivation layer 122 of $SiO_2$ is formed and contact holes 123 for the source and drain regions are opened in it by photolithography and etch (See FIG. 2k).

The final step of making metal contacts 124 and 124' to the source and drain is carried out in the conventional manner. The contacts 124, 124' are placed such that they fall on the thick region of the silicon islands 154, 154' (See FIG. 1).

The above process allows fabrication of high speed, submicron SOI CMOS devices with ultra-thin silicon channels using proven and manufacturable processing steps. Local oxidation with nitride masks and making contacts to 300 nm of silicon film are well proven and manufacturable processes. As a by-product, this method allows the use of good quality, thicker SOI films avoiding the necessity to develop ultra-thin SOI substrate materials.

OXYGEN ION IMPLANT EMBODIMENT

The alternate embodiment, using oxygen ion implantation for channel thinning, will now be described in connection with FIGS. 3a–3d.

Figure 3A:
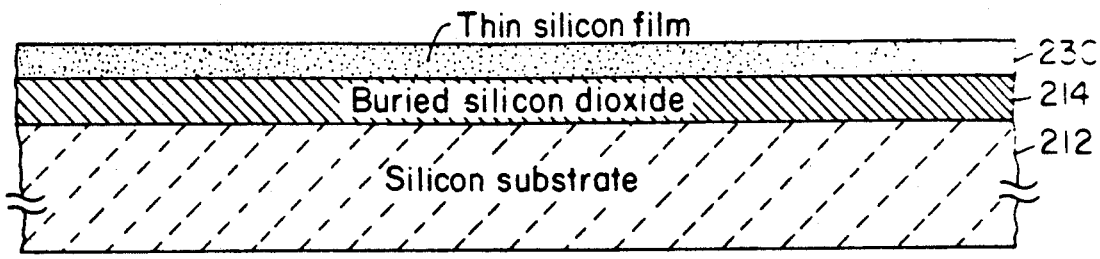
FIGS. 3a-3g are schematic cross-sectional process flow diagrams illustrating the major steps in processing an SOI substrate to fabricate a CMOS device in accordance with an Oxide Implant embodiment of the invention.
Figure 3B:
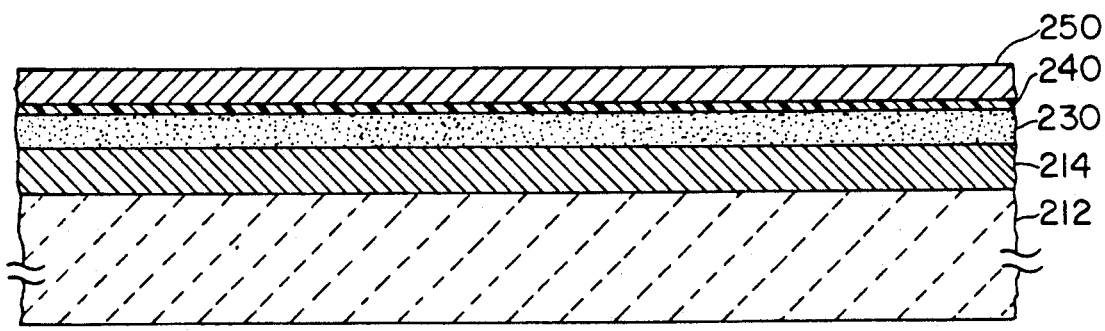
Figure 3C:
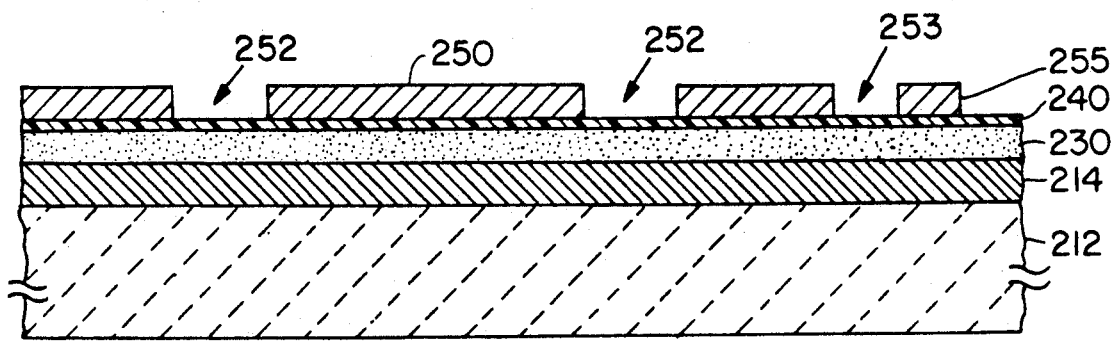

The precursor structure preferably comprises a commercially available SIMOX (separation by implanted oxygen) SOI substrate consisting of bulk Si 212, an $SiO_2$ layer 214 and an epitaxial Si film 230, all as shown in FIG. 3a. The thickness of the silicon film 230 and of the buried oxide 214 in these substrates is each approximately equal to 250 nm.

A thin oxide layer 240 (50–60 nm) is then grown on the silicon film 230. A layer 250 of a masking material (silicon nitride, polysilicon, or refractory metal, such as tungsten) is deposited over the oxide layer 240 (See FIG. 3b).

The masking layer 250 is patterned by photolithography and etch techniques to obtain a pattern with two features. First, the areas where source and drain contacts of the devices are going to be formed, remain covered by the mask material 250 while the area 252 of the oxide over the channel region is exposed. The areas where alignment marks are to be engraved, are also uncovered, as in 253; leaving raised alignment mark 255 or depressed mark 253. These marks will be used in subsequent photolithography steps (See FIG. 3c).

Figure 3D:
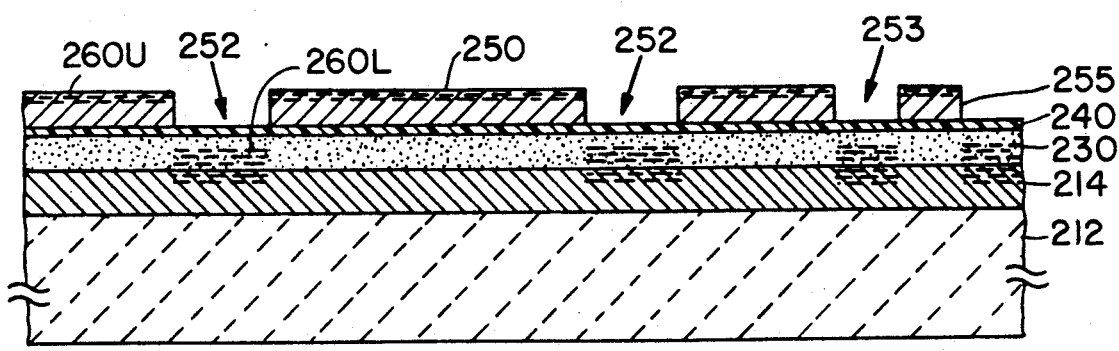

Next, oxygen ions are implanted. In the exposed regions 252 and 253 where the index and channels are to be located the implant is deep; penetrating to the buried oxide layer 214, as indicated by the horizontal dashes at 260L. In the unexposed regions, the ions are absorbed by the masking layer, as indicated by the horizontal dashed lines 260U (FIG. 3d). This implantation increases the thickness of the buried oxide layer 214 in the regions not masked by the masking material. The silicon film thickness in these regions correspondingly decreases to very small value, depending upon the thickness and depth of the oxygen implant. The silicon film in the masked regions (i.e., the future locations of the source and drain regions and the alignment mark locations) remains of the original higher thickness.

The implant mask 250 is then selectively removed by photolithography and etching, while the alignment mark 255 is left in place. A high temperature annealing treatment is then performed (1100° C. to 1300° C. for one to six hours) in an inert atmosphere to produce a stoichometric buried oxide film in the newly implanted region 260L.

Figure 3E:
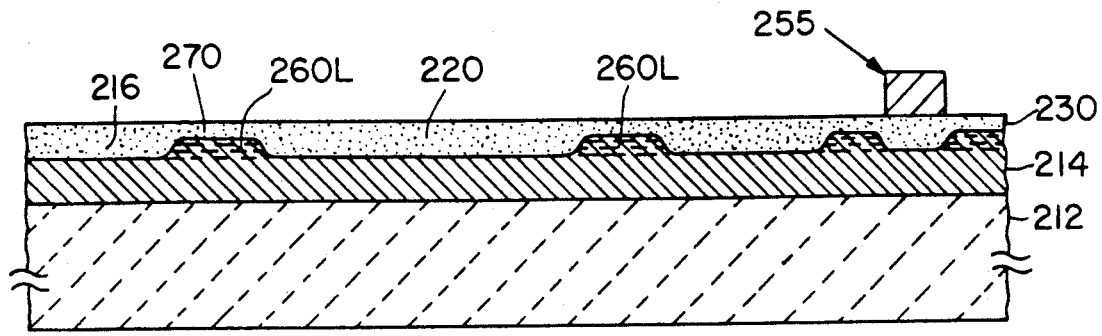
Figure 3F:
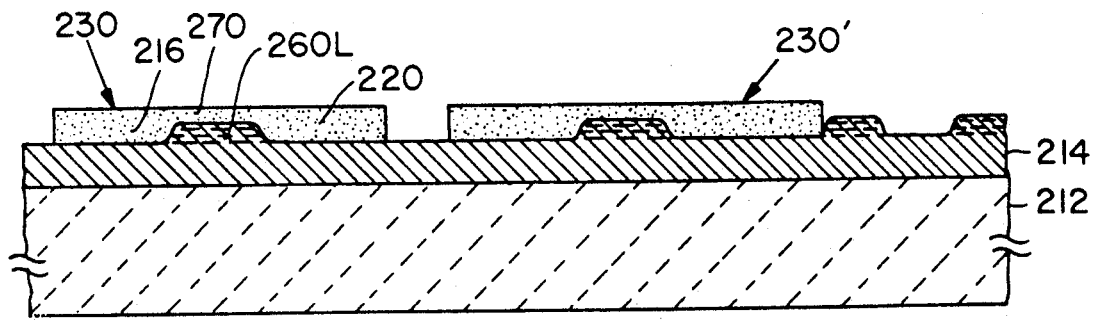

The substrate at this stage has thick silicon regions 216 and 220, respectively, for source-drain contact regions and ultra-thin silicon regions 270 for the device channel (See FIG. 3e). The alignment mark 255 allows further processing to be continued to fabricate CMOS devices using a fabrication process similar to the one described in FIGS. 2g–2k of the first embodiment. First, islands of silicon 230 and 230' are patterned for individual transistors using the alignment mark 255 (See FIG. 3f).

Figure 3G:
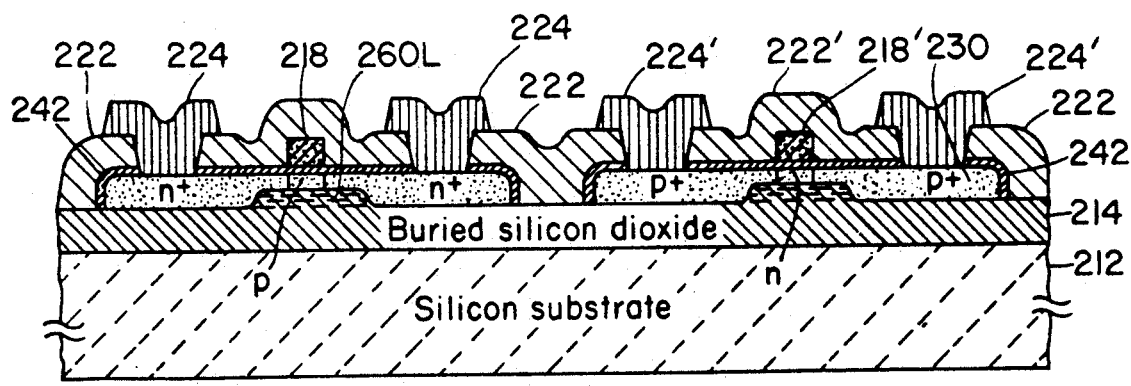

Ion implants are made to the silicon islands to adjust the doping. A gate oxide 242 is formed over the islands. Polysilicon gate electrodes 218 and 218' are formed; n+ source and drain regions are formed in island 230 and a p+ source and drain region in island 230'. A passivation layer 222 of $SiO_2$ is formed over the surface. Contact holes are made through the layer 222 and metal contacts 224 and 224' made to the thick source and drain regions of the islands, as shown in FIG. 3g.

The embodiments shown herein of an SOI MOS device structure should exhibit higher transconductance and operate at higher speeds than the MOS devices of comparable dimensions fabricated in uniformly ultra-thin SOI substrates because of the reduction in the resistance in series with the MOS channel. Yet, the invention allows the use of extremely thin silicon film in the channel region to impart all the advantages of the ultra-thin film to the device while keeping a thicker silicon film in the source drain regions to make fabrication less complicated. This method of device fabrication also produces a planar structure which, as a consequence, permits very high density of devices on a chip. This method makes possible integration of submicron transistors into large chips without a significant yield sacrifice in the complex contact making process.

Equivalents

The above described embodiments are preferred. Other configurations and modifications will now be apparent based upon the present description. Thus, the invention should only be limited in scope by the language of the following claims and equivalents. For example, it is contemplated that alternatively, a focused beam of oxygen ions can be used to implant oxygen in selected areas of the original SOI substrate of FIG. 3a. Alignment marks for aligning the ion beam could also be pre-engraved in the original SOI substrate before implantation. Such a process, using a focused ion beam would make the use of an implantation mask 250 unnecessary. The basic structure of the locally thinned silicon island can be used to make CMOS circuits with further refinements to the fabrication process, such as, LDD structure silicide conductors. The SOI structure may be formed by SIMOX, or ZMR, or other known alternatives, such as wafer bonding or laser recrystallization.

We claim:

1. The method of forming a device with silicon channel regions between silicon source regions and silicon drain regions of an epitaxial silicon film on insulator substrate comprising the steps of:
   a) forming a protective layer over the silicon film;
   b) forming a mask layer over the protective layer;
   c) removing regions of the mask layer to form openings overlying the channel regions;
   d) thinning the silicon regions underlying the openings leaving the source and drain regions on either side the same thickness as the original silicon film.

2. The method of claim 1 including the step of removing the remaining mask layer and forming metal contacts on the source and drain regions and a polysilicon gate electrode on the channel regions.

3. The method of claim 1 wherein the silicon regions are thinned by local oxidation of a surface volume of the silicon underlying the openings.

4. The method of clam 1 wherein the silicon regions are thinned by implantation of oxygen ions in the silicon underlying the openings.

5. The method of claim 1 wherein the silicon-on-insulator substrate is formed by zone melt recrystallization of silicon to form a relatively thick film of epitaxial silicon on a buried oxide insulator on a silicon substrate.

6. The method of claim 1 wherein the substrate is formed by separating the epitaxial silicon film from an underlying silicon base by oxide ion implantation of a volume of the silicon base structure.

7. A method for forming a transistor in an epitaxial silicon layer on insulator on silicon substrate comprising the steps of:
   a) forming a etch stop layer on said silicon layer;
   b) forming a mask layer on said etch stop layer;
   c) removing portions of said mask layer to form openings in locations where transistor channel regions are to be formed in said silicon;
   d) oxidizing said silicon underlying said openings to thin said silicon in said channel regions;
   e) forming a gate dielectric layer over the silicon layer;
   f) forming a gate electrode over the channel regions;
   g) doping the silicon in regions on either side of the gate electrodes to form respective source and drain regions;
   h) forming metal contacts on the source and drain regions.

8. The method of forming a device with silicon channel regions disposed between laterally adjacent silicon source regions and silicon drain regions of an epitaxial silicon film on insulator substrate comprising the steps of:
   a) forming a protective layer over the silicon film;
   b) forming a mask layer over the protective layer;
   c) removing regions of the mask layer to form openings where the channel regions are to be located;
   d) thinning the silicon regions underlying the openings leaving thick regions on either side of thin regions where the source and drain regions are to be located;
   e) removing the mask layer and protective layer and doping the thick regions with a first type conductivity donor and the thin regions between with a second type conductivity donor of opposite conductivity to the first;
   f) forming an insulator over the thin and thick regions;
   g) forming a gate electrode over the insulator opposite the thin region;
   h) forming openings in said insulator to said thick regions; and
   i) forming contacts in said openings.

9. The method of claim 8 wherein the silicon regions are thinned by local oxidation of a surface volume of silicon underlying the openings.

10. The method of claim 8 wherein the silicon regions are thinned by implantation of oxygen ions in the silicon underlying the openings.

* * * * *